United States Patent [19]
Gaultier et al.

[11] Patent Number: 5,355,341
[45] Date of Patent: Oct. 11, 1994

[54] INTEGRATED MEMORY HAVING IMPROVED TESTING MEANS

[75] Inventors: Jean-Marie Gaultier, Rousset; Gérard S. de Ferron, Fuveau, both of France; Roberto Gastaldi, Milan, Italy

[73] Assignee: SGS-Thomson Microelectronics, S.A., Gentilly Cedex, France

[21] Appl. No.: 14,214

[22] Filed: Feb. 5, 1993

[30] Foreign Application Priority Data

Aug. 8, 1990 [FR] France ............................ 90-10114

[51] Int. Cl.$^5$ .............................................. G11C 7/00
[52] U.S. Cl. .............................. 365/201; 365/189.07; 365/189.09; 365/210
[58] Field of Search ............ 365/201, 200, 202, 189.07, 365/210, 189.01, 189.09

[56] References Cited

U.S. PATENT DOCUMENTS

| | | | |
|---|---|---|---|
| 4,802,166 | 1/1989 | Casagrande et al. | 365/201 |
| 4,949,307 | 8/1990 | Camprado | 365/201 |
| 5,091,888 | 2/1992 | Akaogi | 365/210 |
| 5,117,394 | 5/1992 | Amin et al. | 365/202 |
| 5,142,495 | 8/1992 | Canepa | 365/201 |
| 5,218,570 | 6/1993 | Pascucci et al. | 365/210 |

FOREIGN PATENT DOCUMENTS 0241327  10/1987  European Pat. Off. .

OTHER PUBLICATIONS

IEEE Journal of Solid–State Circuits, vol. 23, No. 5, Oct. 1988, New York, pp. 1150–1156 R. Gastaldi, "A 1-Mbit CMOS EPROM with enhanced verification".
Patent Abstracts of Japan, vol. 13, No. 125 (P-847) Mar. 28, 1989.

*Primary Examiner*—Eugene R. LaRoche
*Assistant Examiner*—Tan Nguyen
*Attorney, Agent, or Firm*—Robert Groover

[57] ABSTRACT

An electrically-programmable integrated circuit memory in which the selected memory cell is read by comparing its current output with that of a reference cell, plus a bias current. The bias current is different in test mode than it would be during a normal read operation. The result of this is that, in test mode, cells whose current output is marginal in the unprogrammed state will be detected as faulty, even though those same cells would correctly be read as unprogrammed.

20 Claims, 1 Drawing Sheet

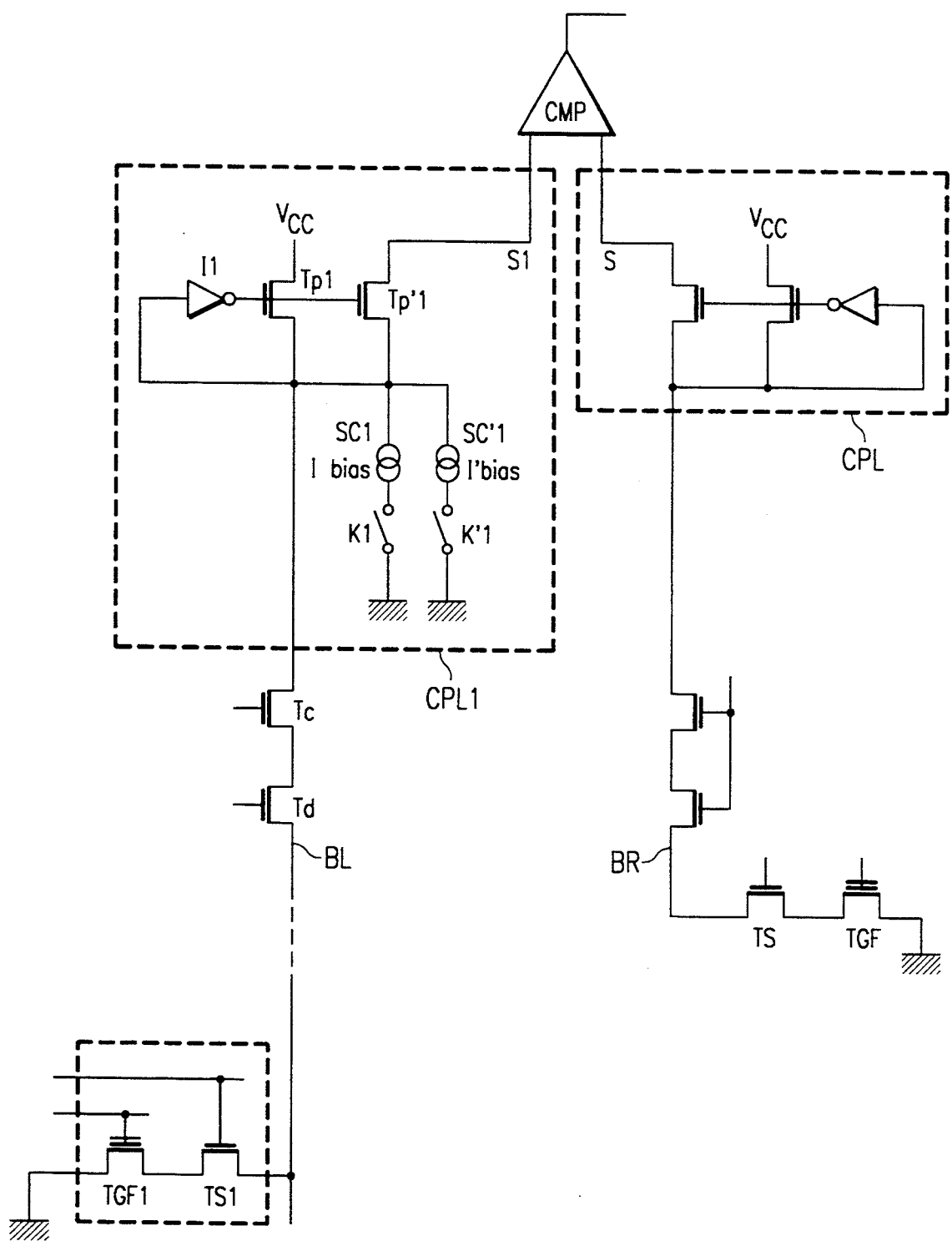

INTEGRATED MEMORY HAVING IMPROVED TESTING MEANS

Cross-Reference to Related Application

This application claims priority from PCT App'n PCT/FR91/00652, filed 6 Aug. 1991, which is hereby incorporated by reference, and therethrough from French App'n 90-10114, filed 8 Aug. 1990.

BACKGROUND AND SUMMARY OF THE INVENTION

The present inventions relate to memories made in integrated circuit form, and especially electrically non-volatile memories that are erasable or non-erasable and reprogrammable or non-reprogrammable.

One of the problems encountered in the manufacture of such memories, when they comprise a very large number of cells, is the need to test them completely before delivering them. The memories are tested in their blank state, to ascertain that there are absolutely no flawed cells.

In the electrically programmable cells that are commonly manufactured at present, the cells are constituted by floating-gate transistors. When the cells are blank, there are no charges stored in the floating gate. If the cell is biased with appropriate reading potentials, the cell should let a current through. If, on the contrary, the cell is programmed, it no longer lets any current through under the same conditions of bias.

However, the current that flows through a blank cell is very weak. To detect it in reading mode, the procedure uses differential reading, by comparison with a reference cell identical to the memory cells. If I is used to designate the current that flows in a cell in reading mode, this current I has a value $I_1$ if the cell is blank and $I_2$ (practically zero) if the cell is programmed. A comparison is made, in a differential current comparator, of the current $I_{ref}$ which flows through the (blank) reference cell with a current that is the sum $I_{+Ibias}$ of the current I in the cell to be read and of a bias current $I_{bias}$. The current $I_{ref}$ is in principle equal to $I_1$ (the current in a blank cell). The bias $I_{bias}$ is chosen so as to be substantially equal to $(I_2-I_1)/2$, i.e. in practice $I_{ref}/2$. In this way, if the current I read in a cell is slightly lower than $I_{ref}/2$, the result of the comparison will be in a first direction and the cell will be considered to be in the programmed state. If, on the contrary, the current I is above $I_{ref}/2$, the result of the comparison will be in the other direction and the cell will be considered to be blank.

The bias current $I_{bias}$ will therefore be aimed at facilitating the comparison between the current of the cell to be read and the reference cell.

During the testing of the memories, the memory is read according to the same principle of differential reading.

It has been perceived, according to the invention, that memories may prove to be flawed during use even though the cells have been tested rigorously one by one. These flaws have been attributed notably to faulty contacts which may occur between the memory cells and a conductor (bit line) to which these cells are connected to transmit the current representing the state of the cell. The contact-forming operation is indeed a delicate operation in the manufacturing process. Not only can the contacts be flawed at the outset, but they can also deteriorate through (natural or enforced) aging.

An aim of the invention is to provide for improved memory testing, to achieve more efficient elimination of chips which include flawed cells, notably as regards the contacts.

According to the invention, it is proposed that the memory should be provided with means to give the bias current a lower value in testing mode than in normal reading mode.

Thus, only the cells for which the reading current in the blank state is high enough will successfully pass the test to verify the blank state. Those with a reading current that is excessively low (albeit sufficient in normal reading mode) will be rejected. This excessively low value will be considered to denote the likely presence of a faulty contact which, in the process of aging, risks causing an erroneous operation of the memory. The cell or the memory will therefore be rejected.

Thus, the electrically programmable integrated memory according to the invention, in which the state of a cell is read by comparison between a current absorbed by a reference cell and the sum of the current absorbed by the cell to be read and a bias current $I_{bias}$ produced inside the integrated circuit, advantageously comprises means for the reduction, in test mode, of the value of the bias current, and for the reading of the state of the cells with this reduced value of the bias current.

The bias current in testing mode is preferably about half the bias current in normal reading mode.

BRIEF DESCRIPTION OF THE DRAWING

The present invention will be described with reference to the accompanying drawing, which shows an important sample embodiment of the invention and which is incorporated in the specification hereof by reference, wherein:

The sole Figure gives a schematic view of the preferred memory reading circuit according to the invention.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

In the Figure, a simple representation has been given of a memory cell constituted essentially by a floating gate transistor TGF1 in series with a selection transistor TS1, and a reference cell constituted identically by a floating gate transistor TGF in series with a transistor TS.

The memory cell to be read is connected to a conductor BL called a "bit line" on which there flows the current absorbed by the cell when it receives the appropriate reading potentials.

The bit line BL is connected by means of transistors Td and Tc to a precharging and reading circuit CPL1. This circuit has the following function: in a first reading step (precharging phase), it takes the bit line to a fixed precharging potential. In a second step (the reading step properly speaking), it detects the current that flows in the bit line.

In the same way, the reference cell is connected to a conductor BR which transmits the current absorbed by the reference cell to a precharging and reading circuit CPL when it receives the appropriate reading potentials.

The transistors Td and Tc are necessary for the working of the memory, notably for the addressing of the bit line connected to the cell selected in reading mode. For reasons of symmetry, identical transistors have been placed between the conductor BR and the reference cell precharging and reading circuit CPL.

The precharging and reading circuits CPL and CPL1 are constituted so as to detect currents; their outputs S and S1 are each connected to a respective input of a comparator CMP which can give a signal as a function of the difference between the currents detected by each of the circuits. However, while the current detected by the circuit CPL is simply the current absorbed by the reference cell, it may be seen that the current detected by the circuit CPL1 is the sum of the current I absorbed in the cell to be read and a bias current.

According to the invention, the bias current has a first value $I_{bias}$ in the normal memory reading mode and a second value $I'_{bias}$ in the blank cell testing mode, the second value being smaller than the first. A change-over switch, controlled for example by a test mode terminal and associated logic which is not shown, can be used to change from the current $I_{bias}$ to the current $I'_{bias}$.

In practice, the bias current is indeed produced by a current source internal to the integrated circuit, this current source being connected to the precharging and reading circuit CPL1 or being incorporated into this circuit. Provision will be made, therefore, for two different sources of current, for example having values $I_{bias}$ and $I'_{bias}$, which can be connected alternately, one of them in place of the other, depending on whether the mode being used is the test mode or the normal operation mode. Alternatively, this may be implemented by a first current source used in test mode and a second source used in parallel with the first one in the normal memory operation mode.

In the simplest practical embodiment, the precharging and reading circuit CPL1 is constituted as follows: it has a precharging transistor Tp1, the source of which is connected by transistors Td and Tc to the bit line and the drain of which is connected to a supply terminal Vcc; it also has a feedback inverter I1 connected between the source and the gate of the transistor Tp1. The transistor Tp1 with the inverter I1 constitutes a servo-control circuit which tends to maintain a fixed precharging voltage in the bit line.

To enable the reading of the current I present in the bit line, the precharging and reading circuit further comprises a mirror transistor T'p1, the source and the gate of which are connected respectively to the source and to the gate of the transistor Tp. The drain of this transistor constitutes the output S1 of the circuit CPL1 and is connected to a first input of the current comparator CMP.

Finally, for the circuit CPL1, a current source SC1 with a value $I_{bias}$ is connected to the common source of the transistors Tp1 and T'p1 for the subtraction, from each transistor, of a current $I_{bias}/2$ (assuming that the transistors Tp1 and T'p1 have identical geometries).

From this structure, there results the fact that the current applied to the input of the comparator CMP is equal to $(I+I_{bias})/2$ (if the transistors Tp1 and T'p1 have the same geometry), I being the current absorbed in the bit line.

The reference cell precharging and reading circuit CPL is constituted identically except that there is no source of bias current $I_{bias}$. Consequently, the current that is applied to the other input S of the comparator is $I_{ref}/2$ if $I_{ref}$ is the current absorbed through the line BR by the blank reference cell.

Finally the precharging and reading circuit CPL1 associated with the bit line BL comprises another current source SC'1 and a means to switch over at least one of the two current sources so that the current $I'_{bias}$ added to the current I of the bit line in the test mode is smaller than the current $I_{bias}$ added in normal reading mode.

In one exemplary embodiment, the current $I'_{bias}$ is equal to about $I_{bias}/2$. However, this value can alternatively be lower or higher.

In the figure, there is shown a switch K1 associated with a current source SC1 having a value $I_{bias}$ and a switch K'1 associated with a source SC'1 having a value $I'_{bias}$. The switches are then controlled in phase opposition, K1 being closed in normal reading mode and open in test mode, K'1 being closed in test mode and open in normal reading mode.

The result of the test operation, like that of a normal read operation, is given by the comparator CMP. The cells are declared to be flawless in test mode if the current that goes through them is greater than $I_{ref}I'_{bias}$, but not if this current is between $I_{ref}I_{bias}$ and $I_{ref}I'_{bias}$. (However, in normal reading mode, a cell output current between $I_{ref}I_{bias}$ and $I_{ref}I'_{bias}$ would be a proper signal.)

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit electrically programmable memory, comprising:
a plurality of programmable cells;
at least one unprogrammed reference cell;
a switchable bias-current generator, connected to provide a bias current with a first value in a test mode and a second value, different from said first value, in a normal reading mode;
a comparator, operatively connected to receive said bias current as an offset, and having a first differential input operatively connected to receive a signal corresponding to the current output of a respective selected one of said programmable cells, and having a second differential input operatively connected to receive a signal corresponding to the current output of said reference cell;

said comparator being connected to provide a logic output in a first state, corresponding to a valid and unprogrammed state of said selected cell, only if the current output of said selected cell differs from the current output of said reference cell by less than the value of said bias current.

2. The integrated circuit of claim 1, comprising a precharging and reading stage in series with said first and second inputs of said comparator.

3. The integrated circuit of claim 1, wherein said bias-current generator provides current of the same polarity as the current output of said reference cell.

4. The integrated circuit of claim 1, wherein each said cell is a floating-gate memory cell.

5. The integrated circuit of claim 1, wherein each said cell is an EPROM memory cell.

6. The integrated circuit of claim 1, wherein said bias current is connected to be summed with the current output of said selected cell.

7. The integrated circuit of claim 1, wherein said second value of said bias current is approximately half of said first value of said bias current.

8. An integrated circuit electrically programmable memory, comprising:

a plurality of programmable cells, each connected, through a respective pass transistor, to a bitline, to draw a current whose value is much larger for a valid unprogrammed cell than for a valid programmed cell;

at least one unprogrammed reference cell;

a switchable bias-current generator, connected to provide a bias current with a first value in a test mode and a second value, smaller than said first value, in a normal reading mode;

a comparator, having a first differential input operatively connected to receive the current output of a respective selected one of said programmable cells, reduced by an amount corresponding to said bias current, and having a second differential input operatively connected to receive a signal corresponding to the current output of said reference cell;

said comparator being connected to provide a logic output in a first state, corresponding to a valid and unprogrammed state of said selected cell, only if the current output of said selected cell differs from the current output of said reference cell by less than the value of said bias current.

9. The integrated circuit of claim 8, comprising a precharging and reading stage in series with said first and second inputs of said comparator.

10. The integrated circuit of claim 8, wherein said bias current is connected to be summed with the current output of said selected cell.

11. The integrated circuit of claim 8, wherein said bias-current generator provides current of the same polarity as the current output of said reference cell.

12. The integrated circuit of claim 8, wherein each said cell is a floating-gate memory cell.

13. The integrated circuit of claim 8, wherein each said cell is an EPROM memory cell.

14. The integrated circuit of claim 8, wherein said second value of said bias current is approximately half of said first value of said bias current.

15. An electrically programmable memory in integrated circuit form in which the state of a cell is read by comparison between a current absorbed by a reference cell and the sum of the current absorbed by the cell to be read and a bias current produced inside the integrated circuit, characterized in that it comprises means for the reduction, in test mode, of the value of the bias current, and for the reading of the state of the cells with this reduced valued of the bias current.

16. A memory according to claim 15, wherein said bias current with reduced value is of the order of half of said bias current in normal reading mode.

17. A method of testing electrically programmable integrated circuit memories, comprising the steps of:

(a.) providing an integrated circuit memory which includes: a plurality of programmable cells; at least one unprogrammed reference cell; a switchable bias-current generator, connected to provide a bias current with a first value in a test mode and a second value, different from said first value, in a normal reading mode; and a comparator, operatively connected to receive said bias current as an offset, and to compare first and second differential inputs and provide a logic output accordingly;

(b.) at the time of manufacture, switching said bias-current generator to provide said bias current with said first value, and reading the current output of each said programmable cell, and accordingly classifying each said programmable cell as good or bad in accordance with the value of said logic output of said comparator;

(c.) thereafter, when a data read is requested from the memory, switching said bias-current generator to provide said bias current with said second value, and reading the current output of each said programmable cell, and accordingly classifying each said programmable cell as programmed or unprogrammed in accordance with the value of said logic output of said comparator;

whereby said step (b.) can identify marginally defective cells, in a newly manufactured memory, which would correctly be identified as unprogrammed in a normal read operation according to said step (c.).

18. The method of claim 17, wherein each said cell is a floating-gate memory cell.

19. The method of claim 17, wherein each said cell is an EPROM memory cell.

20. The method of claim 17, wherein the value of said bias current during said step (c.) is approximately twice the value of said bias current during said step (b-).

* * * * *